(12) United States Patent
Andre et al.

(10) Patent No.: US 10,446,932 B2
(45) Date of Patent: Oct. 15, 2019

(54) CONTACTLESS COMMUNICATIONS ANTENNA FOR PAYMENT TERMINALS

(71) Applicant: INGENICO GROUP, Paris (FR)

(72) Inventors: Jerome Andre, Montoison (FR); Vincent Hernandez, Oytier St Oblas (FR)

(73) Assignee: INGENICO GROUP, Paris (FR)

( * ) Notice: Subject to any disclaimer, the term of this patent is extended or adjusted under 35 U.S.C. 154(b) by 457 days.

(21) Appl. No.: 15/184,148

(22) Filed: Jun. 16, 2016

(65) Prior Publication Data

US 2016/0372829 A1 Dec. 22, 2016

(30) Foreign Application Priority Data

Jun. 16, 2015 (FR) .................................... 15 55517

(51) Int. Cl.
*H01Q 7/02* (2006.01)
*H01Q 1/38* (2006.01)
*H05K 1/02* (2006.01)
*H05K 1/16* (2006.01)

(52) U.S. Cl.
CPC ................ *H01Q 7/02* (2013.01); *H01Q 1/38* (2013.01); *H05K 1/028* (2013.01); *H05K 1/165* (2013.01); *H05K 2201/052* (2013.01); *H05K 2201/055* (2013.01); *H05K 2201/056* (2013.01); *H05K 2201/058* (2013.01); *H05K 2201/09063* (2013.01); *H05K 2201/0979* (2013.01); *H05K 2201/09236* (2013.01); *H05K 2201/10098* (2013.01)

(58) Field of Classification Search
CPC .................................. H01Q 7/02; H01Q 1/38
See application file for complete search history.

(56) References Cited

U.S. PATENT DOCUMENTS

| 4,755,783 | A | | 7/1988 | Fleischer et al. | |
|---|---|---|---|---|---|
| 5,285,191 | A | | 2/1994 | Reeb | |
| 5,398,163 | A | * | 3/1995 | Sano | H05K 1/0281 174/260 |
| 5,883,376 | A | * | 3/1999 | Rosch | G06K 7/10316 235/375 |
| 6,593,900 | B1 | * | 7/2003 | Craven | H01Q 1/38 343/742 |

(Continued)

FOREIGN PATENT DOCUMENTS

| DE | 202004007207 U1 | 12/2004 |
|---|---|---|
| EP | 2334157 A2 | 6/2011 |

(Continued)

OTHER PUBLICATIONS

Search report from FR 1555517, dated Jan. 22, 2016, Kelly Derek.

(Continued)

*Primary Examiner* — Graham P Smith
*Assistant Examiner* — Jae K Kim
(74) *Attorney, Agent, or Firm* — BCF LLP

(57) ABSTRACT

The disclosure relates to a flexible printed circuit board of longitudinal shape comprising at least one conductive track extending over the length of the flexible printed circuit, the flexible printed circuit board comprising at least one folding area shaped so as to allow said flexible printed circuit board to pass from an unfolded state to a folded state in which the conductive track forms at least one antenna loop.

11 Claims, 7 Drawing Sheets

(56) References Cited

U.S. PATENT DOCUMENTS

| | | | |
|---|---|---|---|
| 7,180,001 B1 | 2/2007 | Lin et al. | |
| 2002/0135993 A1* | 9/2002 | Ueyama | H04M 1/0216 361/814 |
| 2010/0052996 A1* | 3/2010 | Ochi | G06K 19/07732 343/702 |
| 2010/0294556 A1 | 11/2010 | Chuo et al. | |
| 2012/0029343 A1 | 2/2012 | Wasson et al. | |
| 2014/0085031 A1* | 3/2014 | Nomura | H05K 1/0242 336/200 |
| 2014/0104117 A1* | 4/2014 | Ukawa | H01Q 1/2208 343/702 |
| 2015/0364938 A1* | 12/2015 | Lapetina | H01F 27/365 320/114 |

FOREIGN PATENT DOCUMENTS

| | | | |
|---|---|---|---|
| JP | 2007305656 A | 11/2007 | |
| WO | 89/08973 A1 | 9/1989 | |
| WO | 2006108472 A1 | 10/2006 | |
| WO | 2007042963 A1 | 4/2007 | |

OTHER PUBLICATIONS

English abstract of JP2007305656 retrieved from Espacenet on Jun. 10, 2016.

English abstract of DE202004007207 retrieved from Espacenet on Jun. 10, 2016.

\* cited by examiner

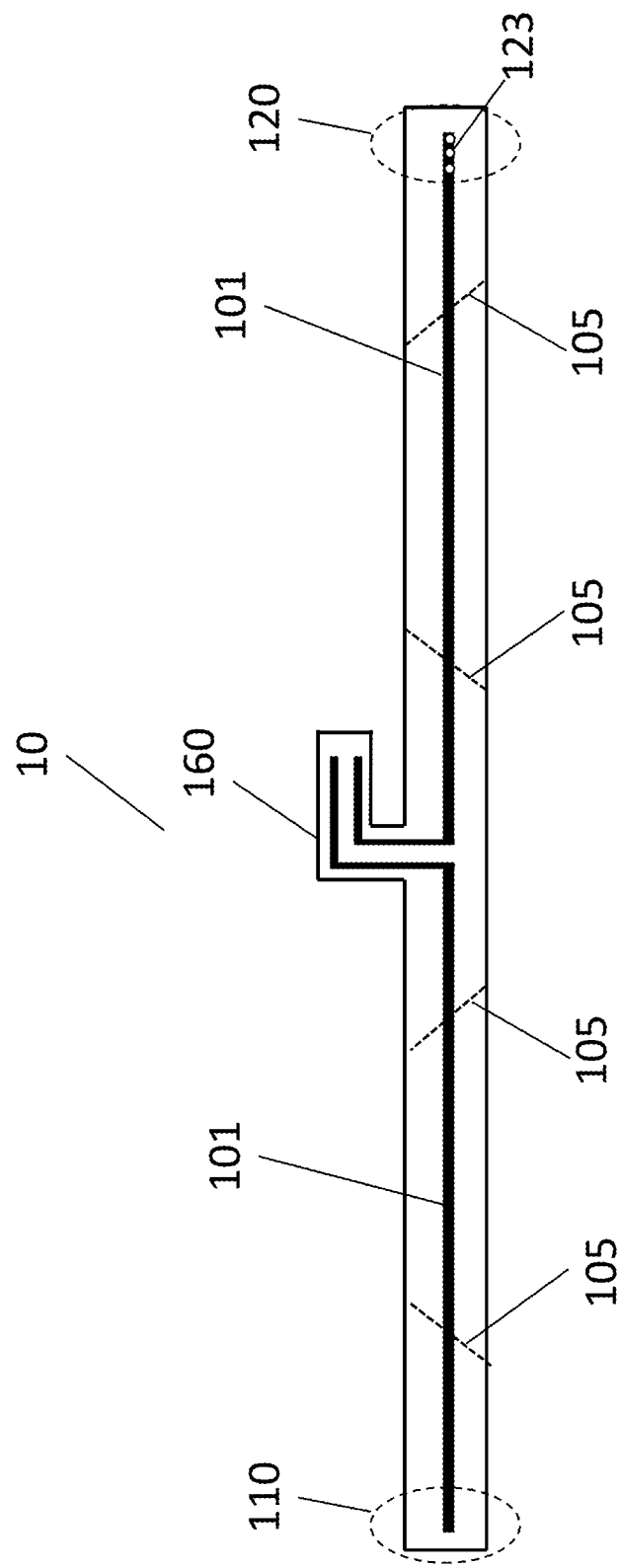

CONTACTLESS COMMUNICATIONS ANTENNA FOR PAYMENT TERMINALS

CROSS-REFERENCE TO RELATED APPLICATION

This United States Non-Provisional Patent Application claims priority from French Patent Application Serial No. 15 55517, filed on Jun. 16, 2015, the entire content of which is incorporated herein by reference.

FIELD OF THE DISCLOSURE

The present disclosure relates to the field of communications antennas. The disclosure relates more particularly to the field of communications antennas for portable devices such as user terminals or payment terminals.

BACKGROUND

At present, user terminals such as smartphones, tablets, as well as payment terminals integrate various techniques for the wireless reception and transmission of data: GSM, Wi-Fi, Bluetooth, NFC. These techniques require the use of transceivers and antennas. The transceivers often take the form of chips which are positioned on a printed circuit board or PCB. Certain transceiver chips are multi-standard chips. This means that they can work with several data transmission techniques. To be able to function accurately, a transceiver chip is especially connected to an antenna. The antenna is a device used to radiate electromagnetic waves (as a transmitter) or pick them up (as a receiver).

One of the techniques most recently integrated into user terminals is a technique of contactless reading. For example, contactless transceiver technology is often used in smartphone-type user terminals or in payment terminals. Such a technique is, for example, that of near-field communications (NFC). Near-field communications (NFC) is a technology of high-frequency, short-range, wireless communications. This technology enables the exchange of data between two compatible devices at a maximum distance of the order of ten centimeters. This technology consists of an extension of connection according to the standards defining proximity cards using RFID or (frequency identification) that combines the interface of a smart card and a reader within a single peripheral device.

The implementing of this data transmission technique within terminals does create a number of problems, especially problems of integration: the space available to obtain this integration is highly limited. Indeed, terminals already have numerous communications functions and numerous antennas and it is difficult to add such an antenna in a terminal. There are also other constraints present such as competition between wireless communications functions (frequency bands can be very close to each other, for certain of these functions, and the modules for sending and receiving data can receive disturbances coming from other communications modules).

For example, a payment terminal integrates numerous modules for reading payment cards: smart cards, stripe cards and contactless cards. NFC technology is increasingly being used to make payments.

For the reading of contactless payment cards, the payment terminal needs to be equipped with a contactless communications antenna. Given the constraints of integration, compactness and ergonomy, the contactless antenna of the terminal is usually situated in the housing of the printer or around the screen of the payment terminal. Besides, in the context of a payment terminal, the payment transaction needs to be made within a predetermined time span. The contactless antenna must therefore enable clear reading (i.e. reading as undisturbed as possible) and fast reading of data coming from a contactless payment card. This is one of the requirements on which the making of a contactless antenna is based.

Thus, in the case of a contactless communications system the antenna of which is situated around the screen of the payment terminal, when the user wishes to make payment by means of his contactless card or his smartphone, he brings this card or smartphone closer to the screen. The designers of payment terminals have indeed deemed it to be necessary for the antenna used for the contactless payment (contactless antenna) to be positioned before the place where the user presents his payment means or in proximity to it.

Besides, it is important to understand that the mounting of a payment terminal is a complex operation carried out mainly by hand and that the designers of terminals must take account of this aspect when they design a novel terminal. The addition of a contactless antenna, which must necessarily be close to the external surface of the terminal (so that the radiation of the antenna will be efficient), has therefore been done in the simplest way possible both in terms of mounting and in terms of positioning.

To this end, the contactless antenna is made in the form of a flexible printed circuit board that goes around the screen. This method of designing the contactless antenna is advantageous from a certain viewpoint. Indeed, the mounting of this antenna is extremely simple. It is enough to place the antenna around the screen and connect the flexible circuit to a connector (an FPC connector) that has been pre-soldered to the motherboard of the terminal.

This method for designing a contactless antenna however raises an economic problem. Indeed, when a flexible printed circuit is manufactured, it has to be paid for on the basis of the total surface area occupied by the flexible printed circuit. In other words, since the contactless antenna goes around the screen, a substantial part of the surface area of the flexible printed circuit (the center, which is empty) has to be paid for even though it is not used. It can be easily understood that when the size of a screen is for example 12 $cm^2$, the fact of having to pay for 12 $cm^2$ of a flexible printed circuit whereas only a small part of this surface area is actually used for making the terminal poses a major problem in terms of costs of manufacturing the terminal.

Besides, this positioning of the flexible printed circuit around the screen also raises a problem in terms of interference. Indeed, in the field of payment terminals, the touch-screens used have the special feature of incorporating a metal sheath or envelope, the purpose of which is to enable the screen to withstand electrostatic discharges. Now this metal sheath produces major interference in the antenna when it is used.

It has recently been proposed to position the wireless communications antenna on the rim of the housing of the printer paper roll. This approach is promising because it appreciably reduces interference received from the screen especially.

In this case, the antenna is constituted by a coil of copper wire in a trough made for this purpose in an internal plastic element of the payment terminal. The method for mounting the antenna consists in winding the copper wire around the plastic part. This approach too causes a problem because it requires substantial space for the antenna. Indeed, to obtain appropriate performance in the antenna, suitable for payment, it is necessary to make at least two loops with a copper wire. These loops lead to an overlapping or straddling of the copper wires and therefore make it necessary to provide sufficient space for this straddling on the internal plastic part. Now since the constraints of compactness are very great, this approach is especially unsuited to payment terminals.

It is therefore necessary to have available a solution for the manufacture and mounting of an antenna that can resolve these problems of the prior art.

SUMMARY

The present disclosure resolves at least some of the problems posed by the prior-art contactless communications antennas. The present disclosure relates more particularly to a flexible printed circuit board of longitudinal shape comprising at least one conductive track extending over the length of the flexible printed circuit, the flexible printed circuit board comprising at least one folding area shaped so as to allow said flexible printed circuit board to pass from an unfolded state to a folded state in which the conductive track forms at least one antenna loop.

Thus, it is possible to have an antenna that is simple and economical to make and, at the same time, can be placed in a 3D space rather than in a flat position as can happen traditionally.

According to one particular characteristic, such a flexible printed circuit comprises: at least two conductive tracks extending over the length of the flexible printed circuit board, said at least two conductive tracks being substantially parallel to each other;

at least one covering area where a first end of the printed circuit board covers a second end of said printed circuit board.

It is thus possible to attach the antenna in a 3D space.

According to one particular characteristic, the covering area comprises means for connecting said at least two conductive tracks to each other in order to form a predefined number of antenna loops.

According to one particular characteristic, the covering area comprises a connector, the connector connecting said at least two conductive tracks to each other in order to form a predefined number of antenna loops.

It is thus possible to act so that the printed circuit tracks, when one of them covers the other, are used to create the turns of a multi-turn antenna.

According to one particular embodiment, the flexible printed circuit comprises a connection extension of said flexible printed circuit board on an appropriate connector.

Thus, affixing the antenna to a printed circuit is a simple task since it is enough to connect the connection extension. No soldering operation is then needed.

According to one particular embodiment, the flexible printed circuit board comprises at least one orifice to affix said flexible printed circuit board to at least one antenna support.

It is thus possible to affix the antenna to a case or to a support in a simple way, thus greatly facilitating the mounting of the antenna.

According to another aspect, the proposed technique also relates to a device comprising wireless communications means implementing a transceiver and an antenna. Such a device comprises a flexible printed circuit board as described here above.

According to one particular characteristic, such a device comprises at least one supporting element on which the antenna is positioned.

FIGURES

Other features and advantages shall appear more clearly from the following description of a particular embodiment of the disclosure, given by way of a simple, illustratory and non-exhaustive example and from the appended drawings, of which:

FIGS. 1a and 1b illustrate a flexible printed circuit board in an unfolded position and in a folded position to obtain a data reception/transmission antenna according to the present technique;

Figure 3:
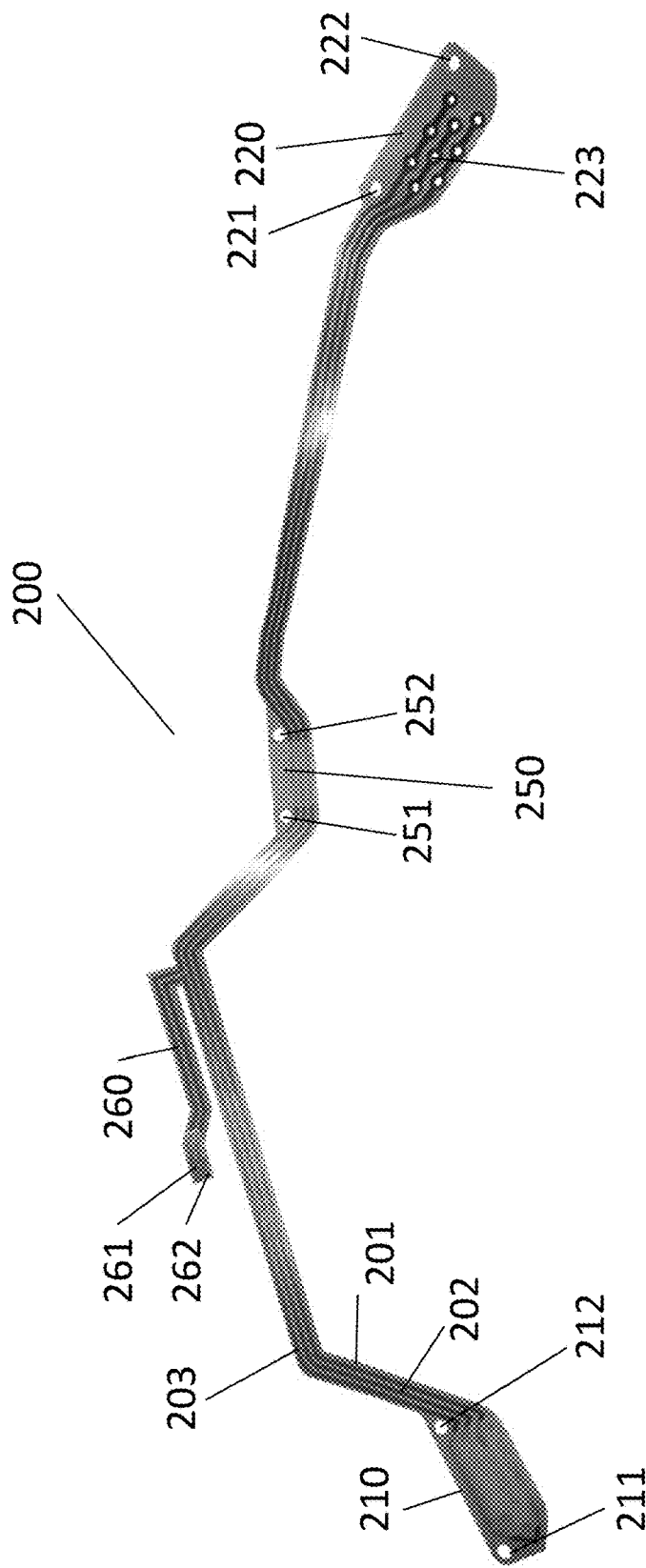
FIG. 3 illustrates a more precise view of an embodiment of FIG. 2 in an unfolded position.
Figure 5:
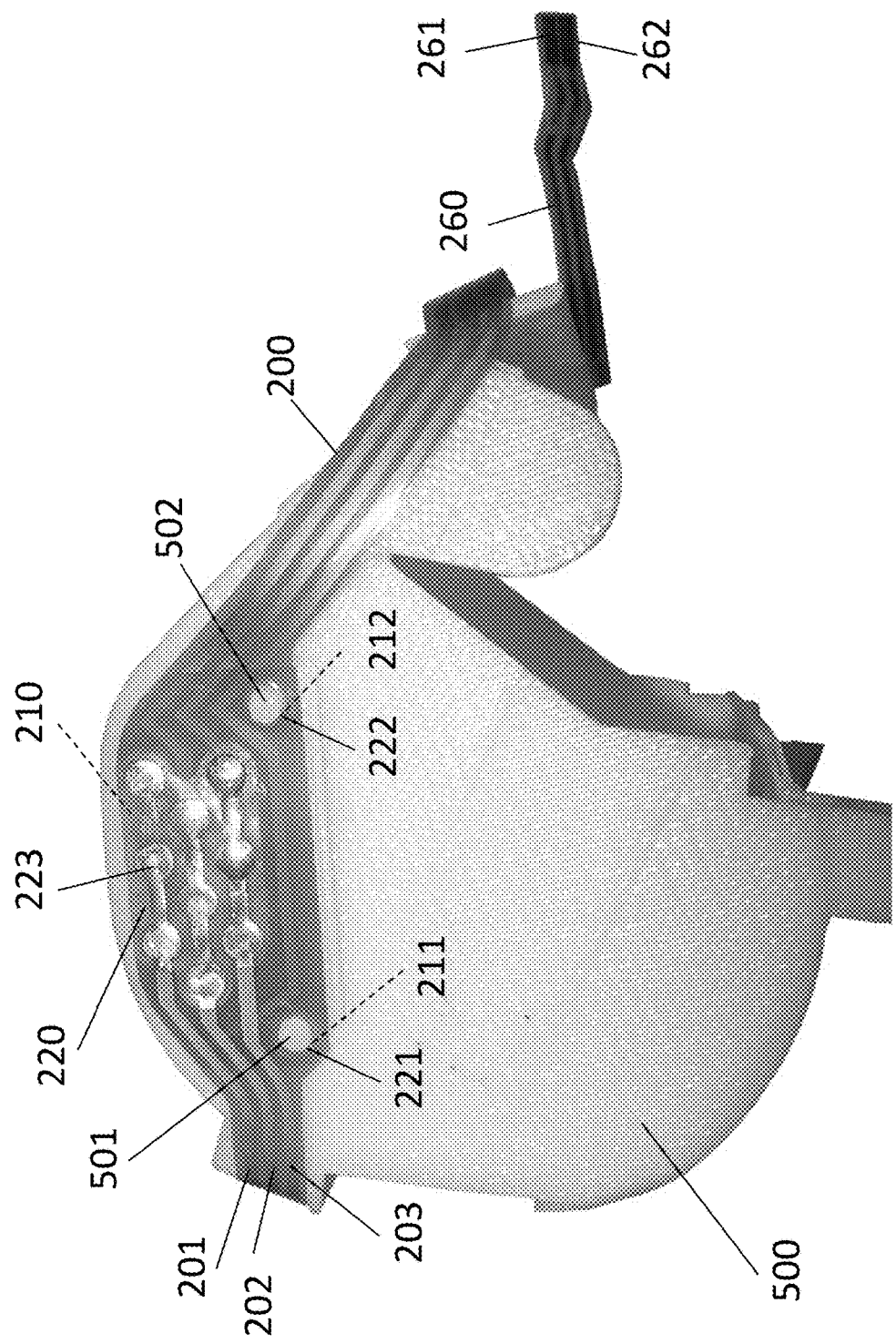
Figure 6:
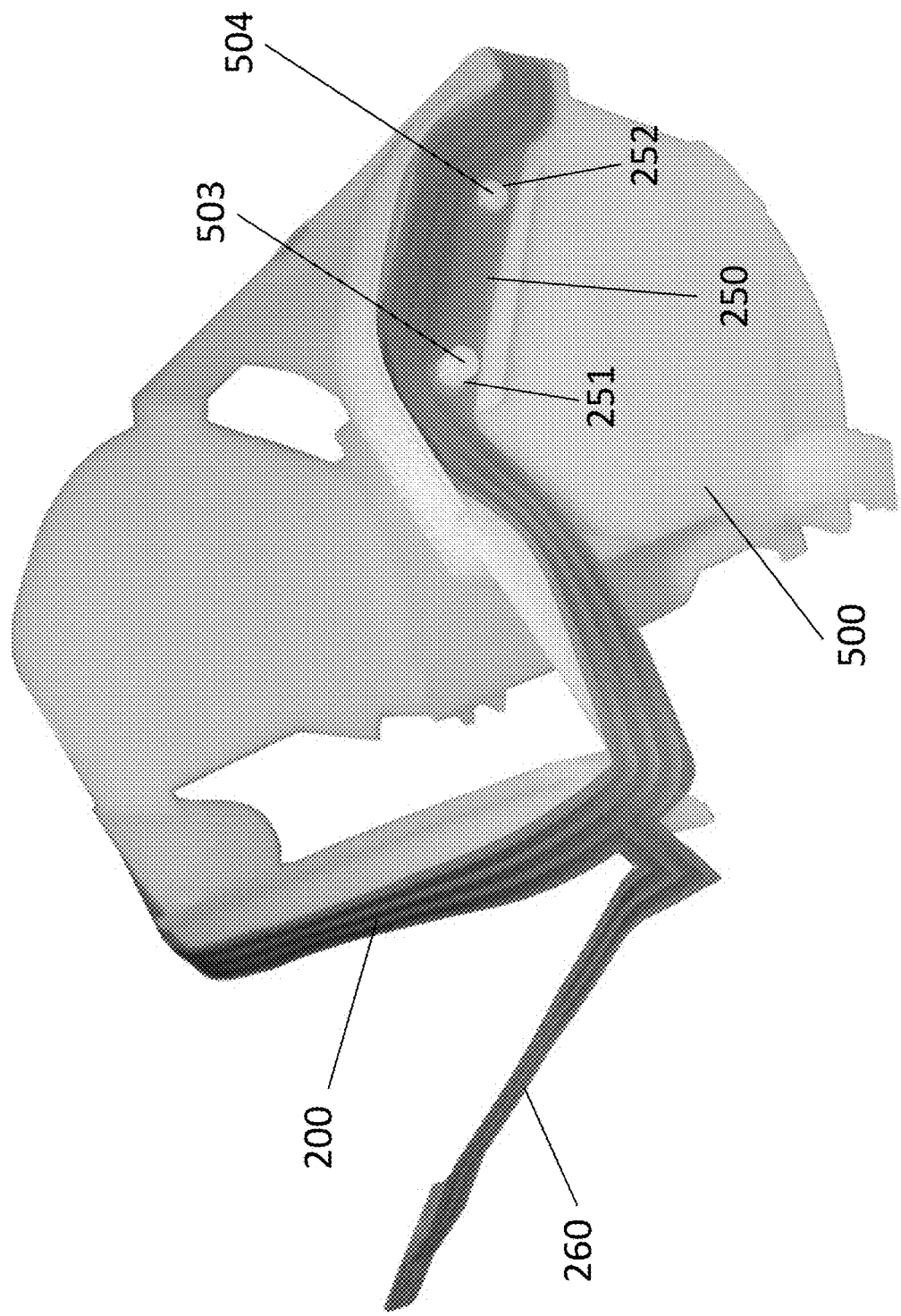

FIGS. 5 and 6 give more a precise illustration of the embodiment of FIG. 3 in a folded position.

DESCRIPTION

As explained here above, in the proposed solution, an antenna is made out of a flexible printed circuit board. To reduce the costs of manufacture as compared with prior-art antennas, also made out of flexible printed circuit boards, a first characteristic of the proposed technique consists in defining a flexible printed circuit board lengthwise in an unfolded position of the antenna. Thus, rather than having to hollow out a flexible circuit (and therefore having to pay for the central hollowed-out part), the printed circuit pattern of the antenna-forming flexible circuit is plotted lengthwise and then folded preliminarily or at the same time as the antenna is mounted.

Figure 1B:
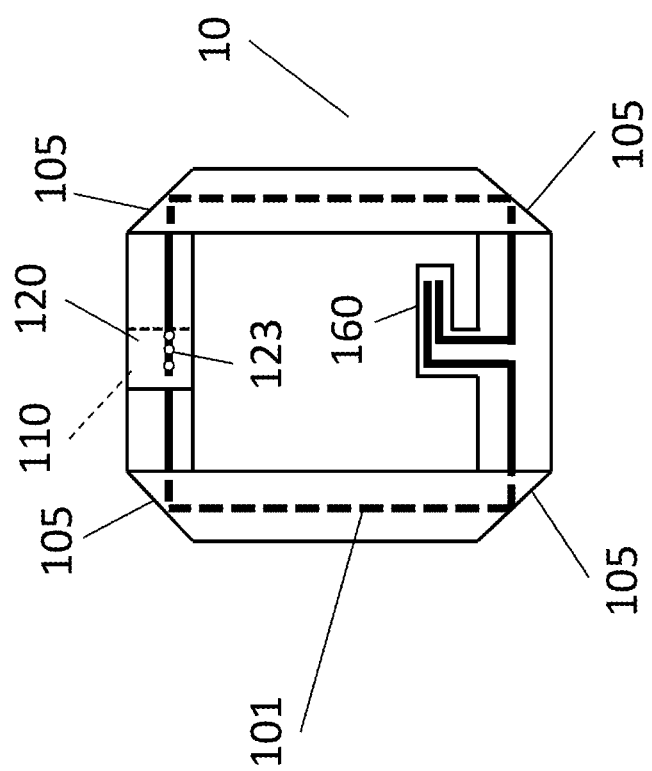

FIG. 1a illustrates a basic version of the antenna according to the present technique. Such an antenna takes the form of a rectangular flexible printed circuit board 10. The width of the printed circuit board is adapted to the number of tracks of the circuit and therefore the number of copper turns of the antenna. In the example of FIG. 1, the flexible printed circuit board comprises a single copper track 101 and a connection extension 160 used to connect the antenna to a connector provided for this purpose on a motherboard of the terminal. FIG. 1b presents the antenna of FIG. 1a in its folded form. As can be seen in this example of FIG. 1b, the folding is antagonistic. This means that, to obtain an antenna with a turn that is situated on the rim of a screen for example, the printed circuit board is folded for example at 45°, four times (following the dashed lines 105 in FIG. 1a which define the folding zones) alternately to the right and then to the left so that, during the folding, the copper track does not come into contact with itself. The folding according to the present disclosure can be a flat folding as explained here above or an intermediate folding which can then be considered to be a deformation or bending rather than a real folding. We thus obtain an antenna, the characteristics of which are the same as with a "hollowed-out" flexible printed circuit board but with a far smaller manufacturing cost precisely because it is not necessary to pay for the hollowed-out part of the flexible circuit. Besides, the wastage entailed in the manufacture of the antenna is also greatly reduced. Thus, this simple example makes it possible to resolve the problems related to the manufacture of an antenna which must be positioned on the rim of a screen. In this example, the flexible printed circuit board comprises two overlaying ends 110, 120 (i.e. ends to be overlaid). These areas are connected to one another during the folding to enable the creation of the loop (or loops when there are several tracks). One of these overlaying ends can include affixing means (123) such as soldering holes so that the antenna can be maintained in the folded position. Conductive gluing points can also be used.

Naturally, other more complex embodiments can be envisaged, such as those described here below. However, this general principle really is that of having a longitudinal flexible printed circuit board comprising at least one copper track (the number of copper tracks represents a number of turns of the antenna), the flexible printed circuit board comprising at least one folding area shaped to enable the flexible printed circuit board pass from an unfolded state to a folded state in which the copper track forms at least one antenna loop.

The flexible printed circuit board can be folded either by hand or by means of a suitable folding machine. The definition of the plane of the flexible printed circuit board (i.e. the unfolded shape of the flexible printed circuit board) takes account, as the case may be, of the folding area or the loss of fold. It is understood, as indicated here above, that the folding is not necessarily a flat folding but can also be folding called a partial folding or a deformation or bending.

Figure 2:
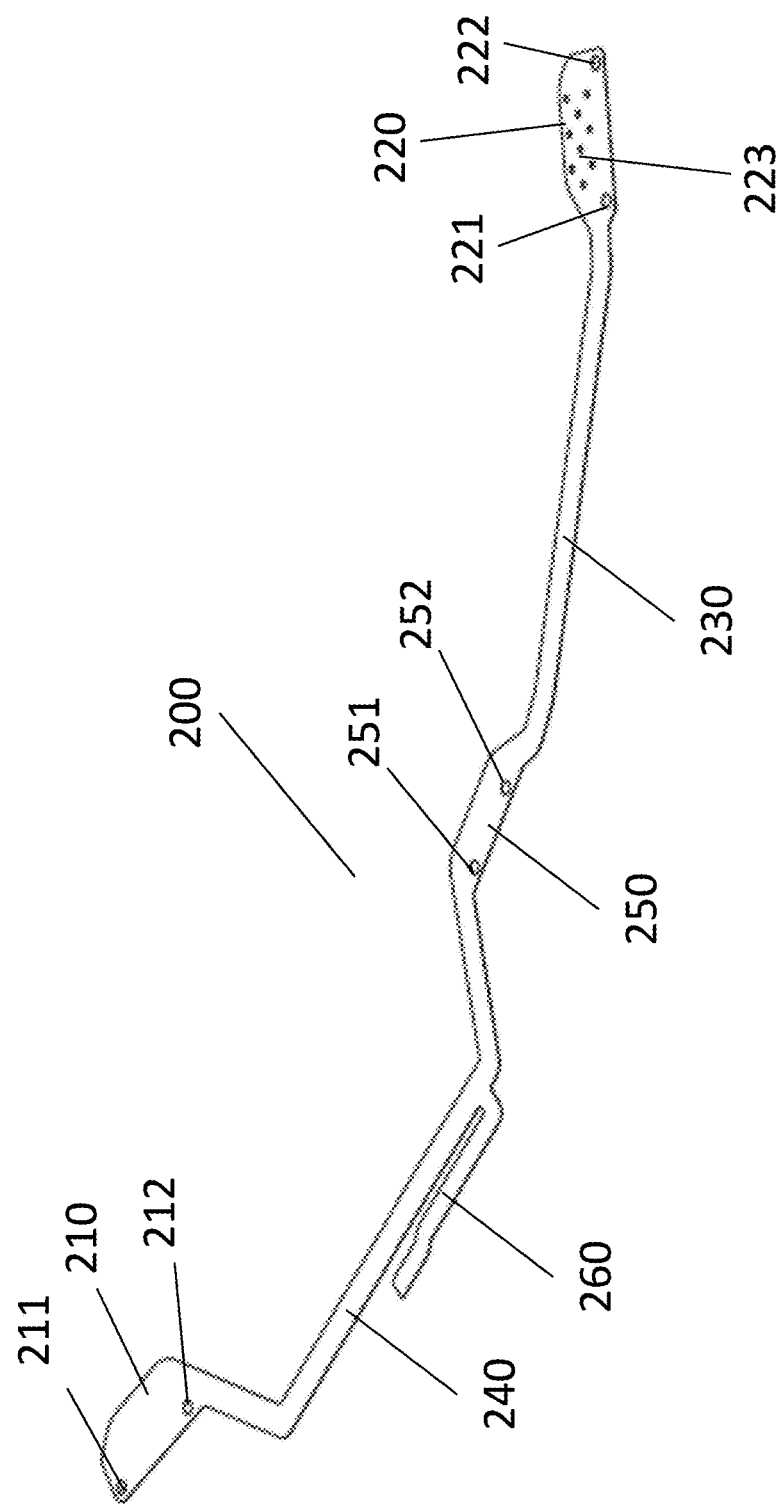
FIG. 2 illustrates an embodiment in an unfolded position.

FIG. 2 illustrates a flexible circuit in an unfolded position according to one embodiment of the disclosure. The pattern of the flexible PCB 10 is plotted lengthwise in an unfolded position and comprises two overlaying ends 210, 220, a central area 250 and two lateral areas 230, 240. The two overlaying areas 210, 120 and the central area each comprise two affixing orifices 111,112, 221, 222, 151, 152. One of the two areas 210, 222 to be overlaid comprises holes 223 for the soldering of these two areas 210, 220 to be overlaid. A connection extension 260 enabling the connection of the antenna to a connector provided for this purpose on a motherboard is available on one of the two lateral areas 130, 140. FIG. 3 illustrates a flexible printed circuit according to one specific embodiment of the disclosure. The flexible printed circuit 200 comprises three copper tracks 201, 202, 203. Holes 221, 222, 223 are disposed on the copper tracks at the end 220 that is to be overlaid. The holes 221 and 222 are intended for affixing the antenna to the receiver part, at locations provided for this purpose. The holes 223 are intended to enable a soldering of the two areas 210 and 220 to be overlaid. The connection extension 260 comprises two soldering points 261, 262 which can be soldered or plugged into a connector on the motherboard of the payment terminal.

Unlike in the prior-art approach, the lengthwise flexible circuit enables the cost of material to be reduced. Indeed, in the prior-art solution, the flexible circuit is designed in the form of a loop. The center of the loop is thereafter hollowed out in order to make the antenna. This hollowed-out part still has to be paid for the by the manufacturer. Thus, the lengthwise flexible circuit in an unfolded position according to the disclosure averts the need to pay for the hollowed-out part as in the prior-art solution.

Figure 4:
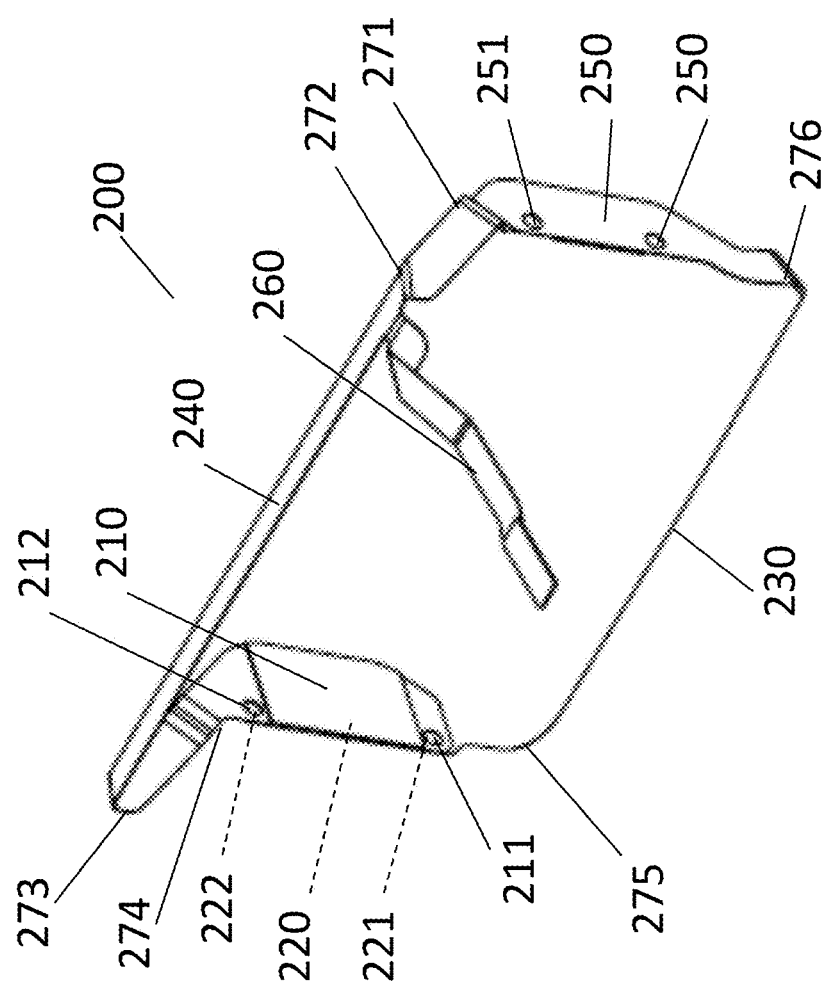
FIG. 4 illustrates the embodiment of FIG. 2 in a folded position.

FIG. 4 illustrates a flexible circuit 200 in a folded position, forming a contactless communications antenna in a payment terminal according to one embodiment of the disclosure. The flexible circuit in a folded position (the antenna) is made by an operation for folding or deforming the flexible circuit in an unfolded position 100 illustrated in FIG. 1. This folding operation is made on several folding areas 271, 272, 273, 274, 275, 276. The flexible circuit in a folded position comprises two overlaid ends 210, 220, a central area 250 and two lateral areas 230, 240. The two areas 210, 220 to be overlaid and the central area each comprise two affixing orifices 211,212, 221, 222, 251, 252 enabling the antenna to be affixed to the supporting element in the payment terminal. In this folded position, the two fastening orifices 211, 212 on one end 210 to be overlaid coincide respectively with the two affixing orifices 221, 222 on the other end 220 to be overlaid. One of the two ends 210, 220 to be overlaid comprises holes (not shown) for soldering the two areas 210, 220 to be overlaid.

FIGS. 5 and 6 illustrate the closing of the loop of the flexible circuit during the mounting of the antenna on a supporting part which, in this embodiment, is a housing 500 for the paper roll. The two ends 210, 220 to be overlaid are overlaid and are affixed by soldering. The soldering is done by positioning the holes 223 on the three copper tracks 201, 202, 203 in the overlaying end 220 which gets folded above the solder pads of the other overlaying end which is situated beneath. The ends of the copper tracks 201, 202 and 203 in the overlaying end 220 are respectively soldered to the other ends of the tracks 201, 202 and 203 on the overlaying end 210, through holes 223. Such a soldering operation makes it possible both to close the flexible circuit loop 200 and to connect the three copper tracks 201, 203, 203 to define the number of loops of the antenna (in this case three in this embodiment). Indeed, the overlaying of the two ends is defined so that the track 201 is soldered to the track 202 which is itself soldered with the track 203: thus, at the end of the soldering operation, we obtain a single conductive track forming three turns around the supporting part (the housing 500). The affixing orifices 221, 222 on the overlaying end 220 are respectively overlaid on the affixing orifices 211, 212 on the overlaying end 210 and form two overlaid affixing orifices. The shape of the folded flexible circuit 200 matches the external shape of the housing 500. During the mounting, two fastening means 501, 502 (pins, clips) disposed on the housing 500 pass through the two overlaid affixing orifices. On the other side of the housing as illustrated in FIG. 6, two affixing means 503, 504 pass through the two affixing holes 251, 252 positioned on the central area 250 of the flexible circuit. The diameter of the affixing means 501, 502, 503, 504 (pins, clips) is greater than that of the affixing orifices 211, 212, 221, 222, 251, 252, and enables the affixing means to hold the flexible circuit while at the same time preserving the ease of mounting of the flexible circuit. During the mounting of the payment terminal, the two soldering points 261, 262 are soldered to its motherboard. The antenna thus becomes operational for receiving and sending signals.

According to another embodiment, the two ends 210, 220 to be overlaid are overlaid and folded in an area on a PCB and affixed to it with a connector through affixing holes 211, 212, 221, 222. The two ends 210, 220 to be overlaid can however be positioned without being overlaid in an area on the PCB and affixed to it with two connectors through affixing holes 211, 212, 221, 222.

According to another embodiment, the flexible circuit in folded position comprises two ends which are overlaid on a folding area. The closing of the loop is made by stapling or crimping of the two overlaid ends.

The invention claimed is:

1. An elongate flexible printed circuit board comprising:
at least two conductive tracks extending over a length of the elongate flexible printed circuit, the at least two conductive tracks being substantially parallel to each other; and at least one folding area shaped so as to allow said elongate flexible printed circuit board to pass from an unfolded state to a folded state, in the unfolded state a first end of the elongate flexible printed circuit board is spaced from a second end of the elongate flexible printed circuit board, in the folded state the first end of the elongate flexible printed circuit board overlays the second end of the elongate flexible printed circuit board such that the at least two conductive tracks form at least one antenna loop.

2. The elongate flexible printed circuit board of claim 1, wherein at least one of the first and second ends of the elongate flexible printed circuit board comprises means for connecting said at least two conductive tracks to each other in order to form the at least one antenna loop.

3. The elongate flexible printed circuit board of claim 1, further comprising a connection extension for connecting the at least one antenna loop to an appropriate connector.

4. The elongate flexible printed circuit board of claim 1, further comprising at least one orifice for affixing said elongate flexible printed circuit board to at least one antenna support.

5. The elongate flexible printed circuit board of claim 1, wherein at least one of the first and second ends of the elongate flexible printed circuit board comprises a connector for connecting said at least two conductive tracks to each other in order to form the at least one antenna loop.

6. A device comprising:
a transceiver; and
an antenna, the antenna comprising an elongate flexible printed circuit board, the elongate flexible printed circuit board comprising:
at least two conductive tracks extending over a length of the elongate flexible printed circuit, the at least two conductive tracks being substantially parallel to each other; and
at least one folding area shaped so as to allow said elongate flexible printed circuit board to pass from an unfolded state to a folded state, in the unfolded state a first end of the elongate flexible printed circuit board is spaced from a second end of the elongate flexible printed circuit board, in the folded state the first end of the elongate flexible printed circuit board overlays the second end of the elongate flexible printed circuit board such that the at least two conductive tracks form at least one antenna loop.

7. The device of claim 6, wherein at least one of the first and second ends of the elongate flexible printed circuit board comprises means for connecting said at least two conductive tracks to each other in order to form the at least one antenna loop.

8. The device of claim 6, wherein the elongate flexible printed circuit board further comprises a connection extension for connecting the antenna to an appropriate connector.

9. The device of claim 6, further comprising at least one antenna support; and
wherein the elongate flexible printed circuit board further comprises at least one orifice for affixing said elongate flexible printed circuit board to the at least one antenna support.

10. The device of claim 6, wherein at least one of the first and second ends of the elongate flexible printed circuit board comprises a connector for connecting said at least two conductive tracks to each other in order to form the at least one antenna loop.

11. The device of claim 6, further comprising at least one supporting part on which said antenna is positioned.

* * * * *